(12) United States Patent
Moiraghi et al.

(10) Patent No.: US 8,134,416 B2
(45) Date of Patent: Mar. 13, 2012

(54) SURFACE ACOUSTIC WAVE DRIVING CIRCUIT AND OSCILLATOR THEREFOR

(75) Inventors: Guido Moiraghi, Milan (IT); Luca Moiraghi, Milan (IT); Paolo Moiraghi, Marcignago (IT)

(73) Assignee: STE s.a.s di G. Moiraghi & C., Milan (IT)

( * ) Notice: Subject to any disclaimer, the term of this patent is extended or adjusted under 35 U.S.C. 154(b) by 7 days.

(21) Appl. No.: 12/733,048

(22) PCT Filed: Jul. 18, 2008

(86) PCT No.: PCT/EP2008/059431
§ 371 (c)(1),
(2), (4) Date: Feb. 4, 2010

(87) PCT Pub. No.: WO2009/019121
PCT Pub. Date: Feb. 12, 2009

(65) Prior Publication Data
US 2010/0134194 A1    Jun. 3, 2010

(30) Foreign Application Priority Data

Aug. 6, 2007  (EP) ..................... 07425513

(51) Int. Cl.
*H03B 5/12* (2006.01)
(52) U.S. Cl. ......... 331/107 A; 331/107 DP; 331/116 M; 331/167
(58) Field of Classification Search .................. 331/167, 331/116 M, 107 A, 107 DP
See application file for complete search history.

(56) References Cited

U.S. PATENT DOCUMENTS

| | | | |
|---|---|---|---|
| 4,684,853 A | 8/1987 | Coash | |
| 5,105,162 A | 4/1992 | Fleissner | |
| 5,856,764 A | 1/1999 | Kobayashi | |
| 6,285,866 B1 | 9/2001 | Lee | |
| 6,933,794 B2 * | 8/2005 | Ogiso | ....................... 331/107 A |
| 2005/0059375 A1 | 3/2005 | Abe | |

* cited by examiner

*Primary Examiner* — Arnold Kinkhead
(74) *Attorney, Agent, or Firm* — Jacobson Holman PLLC

(57) ABSTRACT

A driving circuit of a surface wave resonator (X1) is described; the resonator comprises a static capacitor (Co) and the driving circuit is adapted to supply a voltage (Vx) to the resonator. The driving circuit comprises reactive means (L3) adapted to resonate in combination with said static capacitor (Co) of the resonator at a predetermined frequency (Fo) in the initial driving period of the resonator at said voltage; the driving circuit comprises passive means (R3) adapted to determine oscillations at said predetermined frequency (Fo).

9 Claims, 2 Drawing Sheets

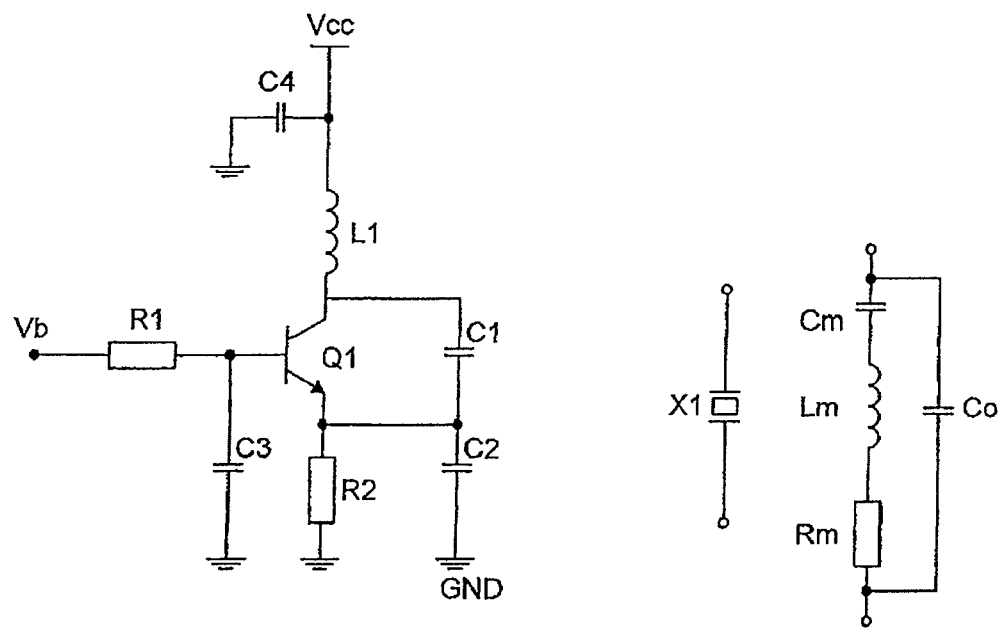
Fig.1 PRIOR ART
Fig.2
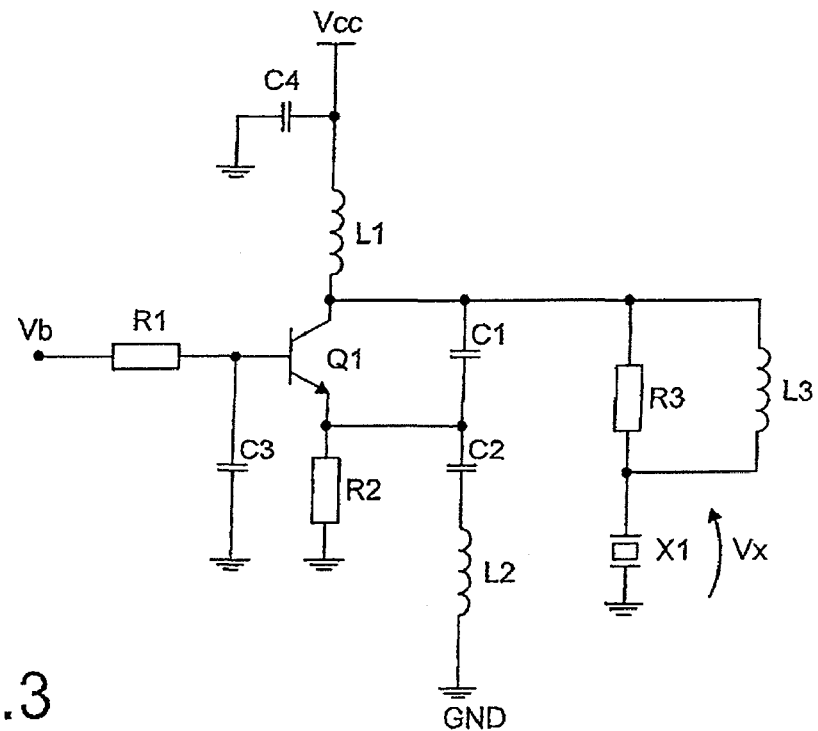
Fig.3

US 8,134,416 B2

SURFACE ACOUSTIC WAVE DRIVING CIRCUIT AND OSCILLATOR THEREFOR

This is a national stage of PCT/EP08/059431 filed Jul. 18, 2008 and published in English, which has a priority of European no. 07425513.4 filed Aug. 6, 2007, hereby incorporated by reference.

DESCRIPTION

The present invention relates to a surface wave resonator driving circuit and to the oscillator thereof.

Oscillators in which oscillation frequency is stabilized by quartzes or piezoelectric resonators are known. Oscillators using Surface Acoustic Waves (SAW) are currently used in radio frequency signal and data transmission systems; said resonators are mainly used in ISM (Industrial, Scientific and Medical) frequency bands and for SRDs (Short Range Devices).

The oscillator circuits which use SAW resonators show a certain initial delay, in the order of approximately 20 or 30 microseconds, to start oscillating.

Given the described state of the art, the object of the present invention is to provide a surface wave resonator driving circuit which allows to start oscillating very rapidly, in the order of about a hundred nanoseconds.

According to the present invention, such object is reached by a surface wave resonator driving circuit, said resonator comprising a static capacitor and said driving circuit being adapted to supply a voltage to said resonator, characterized in that it comprises reactive means adapted to resonate in combination with said static capacitor of the resonator at a predetermined frequency of the initial driving period of the resonator at said voltage, said driving circuit comprising passive means adapted to determine oscillations at said predetermined frequency.

The features and the advantages of the present invention will be apparent from the following detailed description of a practical embodiment thereof, shown by way of non-limitative example in the accompanying drawings, in which:

FIG. 1 shows a circuit diagram of a Colpitts oscillator according to the known art;

FIG. 2 shows a SAW resonator and its equivalent circuit;

FIG. 3 shows an oscillator according to the present invention;

FIG. 1 shows a circuit diagram of a Colpitts oscillator according to the known art. Said oscillator comprises a bipolar transistor Q1 having the base terminal connected to a terminal of a resistor R1 having the other terminal connected to a polarization voltage Vb, a capacitor C1 arranged between the base terminal and the ground GND. Transistor Q1 has the emitter terminal coupled to ground GND by means of the parallel of a resistor R2 and a capacitor C2 and the collector terminal coupled to the supply voltage Vdc by means of an inductor L1; a capacitor C4 is arranged between the supply voltage and ground GND and another capacitor C1 is arranged between the emitter and the collector terminals of transistor Q1.

FIG. 2 shows a SAW resonator X1 and its equivalent circuit consisting of a capacitor Co in parallel to the series of a capacitor Cm, an inductor Lm and a resistor Rm (motional capacitor, inductor and resistor) which represent the electric equivalent of the mechanical features of the SAW resonator.

FIG. 3 shows an oscillator according to the present invention. The oscillator comprises a driving circuit, e.g. the Colpitts circuit in FIG. 1, which is coupled to a SAW resonator X1 by means of the parallel of a resistor R3 and an inductor L3 arranged between the collector terminal of transistor Q1 and resonator X1. The Colpitts circuit in such circuit diagram becomes a driving circuit of surface wave resonator X1; resonator X1 comprises a static capacitor Co and said driving circuit is adapted to supply a voltage Vx to said resonator. The driving circuit comprises reactive means, i.e. inductor L3, having a value so as to resonate in combination with said static capacitor Co of the resonator at a predetermined frequency Fo in the initial driving period of the resonator at said voltage Vx; the driving circuit comprises passive means, i.e. resistor R3, adapted to determine and maintain oscillations at said predetermined frequency Fo during operation.

Figure 4:
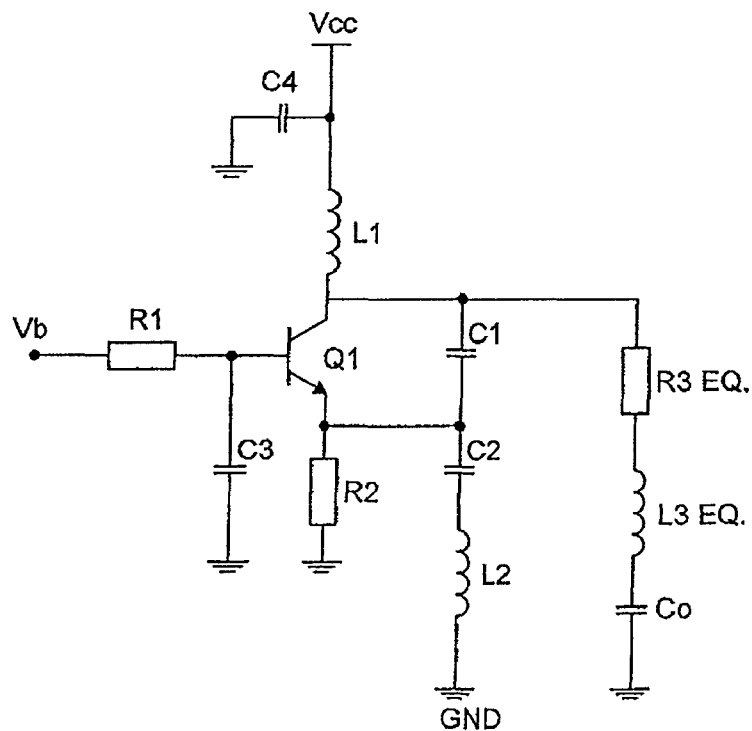
FIG. 4 shows the oscillator in FIG. 3 during the step of starting up.

FIG. 4 shows the oscillator in FIG. 3 during the step of starting up in which, for greater clarity, equivalent serial circuit R3eq and L3eq is shown instead of parallel circuit R3 and L3. Said step immediately follows the step of applying polarization voltage Vb to the base terminal of transistor Q1 which allows to apply voltage Vx to resonator X1; in such situation, resonator X1 is quiescent and only static capacitor Co is present in the equivalent circuit. The value of inductor L3eq is such that its reactance and the reactance of capacitor Co at frequency Fo are reciprocally elided; the presence of resistor R3eq allows to start the oscillation at a frequency close to Fo.

Figure 5:
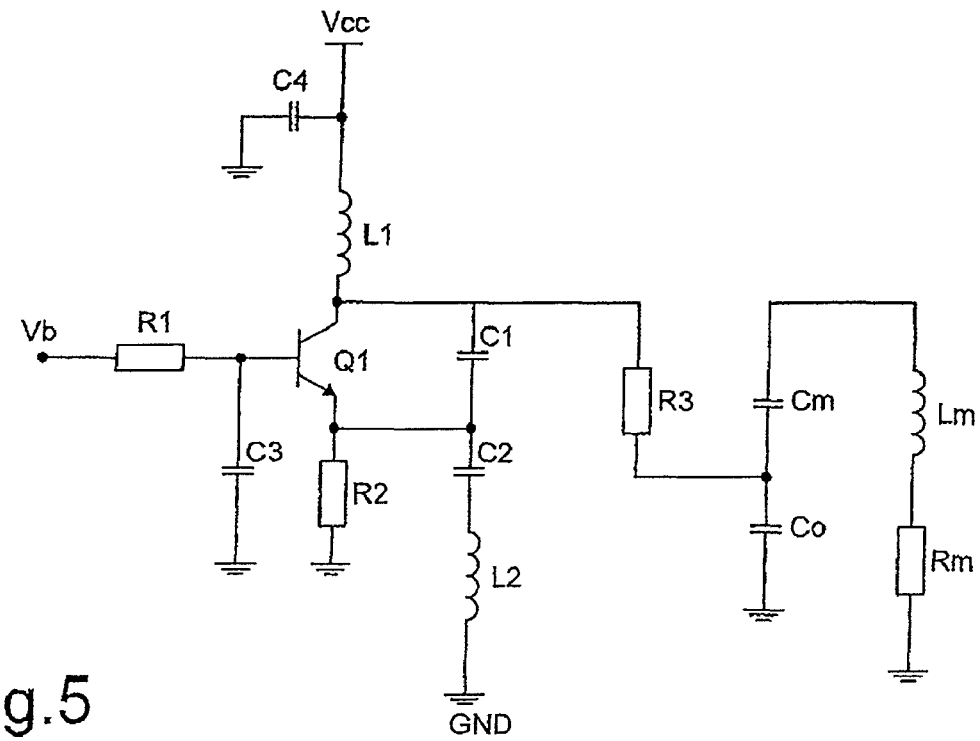
FIG. 5 shows the oscillator in FIG. 3 during the step of running

FIG. 5 shows the oscillator in FIG. 3 during the step of running After a short period of time, of approximately 50 nanoseconds, the SAW resonator, having overcome the mechanical inertia, starts oscillating and the circuit is modified as shown in FIG. 5. The value of inductor 13 is negligible with respect to the value of the total reactance Lm of X1. The equivalent circuit of resonator X1 presents a very high impedance at the resonator frequency and by means of resistor R3 the resonator is forced to oscillate at the parallel resonance frequency equal to frequency Fo.

Preferably, an inductor L2 is added in series to capacitor C2; this allows to decrease the frequency variation of the oscillator according to the variations of voltage Vb from zero to its nominal value.

A driving circuit with the values of inductors L1, L2 and L3 variable from a few nanohenries to hundreds of nanohenries, with the values of capacitors C1 and C2 in the order of one picofarad or tens of picofarads and with values of resistor R3 in the order of hundreds of Ohms, allows to drive the SAW resonator so that is starts oscillating very rapidly, in the order of about one hundred nanoseconds.

An embodiment of the driving circuit comprises the sequence of values: L1=18 nH, L2=3.3 nH, L3=82 nH, C1=8 pF, C2=18 pF, R3=470 Ohms at a frequency Fo=434 Mhz. Another embodiment of the driving circuit comprises the sequence of values: L1=22 nH, L2=3.3 nH, L3=150 nH, C1=12 pF, C2=22 pF, R3=470 at a frequency Fo=315 Mhz.

The invention claimed is:

1. A surface wave resonator driving circuit, said resonator comprising a static capacitor and said driving circuit being adapted to supply a voltage to said resonator, wherein it comprises reactive means adapted to resonate in combination with said static capacitor of the resonator at a predetermined frequency of the initial driving period of the resonator at said voltage, said driving circuit comprising passive means adapted to determine oscillations at said predetermined frequency, and wherein said reactive means has a value so as to be essentially negligible with respect to the total reactance of the surface wave resonator after a predetermined initial period of time from the application of said voltage to said surface wave resonator.

2. The circuit according to claim 1, wherein said passive means is adapted to force the surface wave resonator to essentially oscillate at said predetermined frequency after said predetermined initial period of time.

3. The circuit according to claim 1, wherein said reactive means is an inductor.

4. The circuit according to claim 1, wherein said passive means is a resistor.

5. The circuit according to claims 3, wherein said inductor and said resistor are arranged in parallel and arranged in series to said surface wave resonator.

6. The circuit according to claim 5, wherein it comprises a bipolar transistor having the collector terminal coupled to a supply power by means of another inductor, the base terminal coupled at a polarization voltage by means of another resistor, the emitter terminal coupled to ground by means of the parallel of a further resistor and another capacitor, said circuit comprising a further capacitor arranged between the collector terminal and the emitter terminal.

7. The circuit according to claim 6, wherein it comprises a further inductor connected between said other capacitor and ground.

8. The circuit according to claim 2, wherein said initial period of time is essentially 50 nanoseconds.

9. The oscillator comprising a surface wave resonator and a driving circuit as defined in claim 1.

* * * * *